(12) United States Patent
Niu (10) Patent No.: US 9,589,834 B2
(45) Date of Patent: Mar. 7, 2017

(54) ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventor: Jing Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 326 days.

(21) Appl. No.: 14/357,725

(22) PCT Filed: Dec. 5, 2013

(86) PCT No.: PCT/CN2013/088658
§ 371 (c)(1),
(2) Date: May 12, 2014

(87) PCT Pub. No.: WO2014/206015
PCT Pub. Date: Dec. 31, 2014

(65) Prior Publication Data
US 2016/0195751 A1    Jul. 7, 2016

(30) Foreign Application Priority Data

Jun. 24, 2013   (CN) .......................... 2013 1 0252982

(51) Int. Cl.
*H01L 27/088*       (2006.01)
*H01L 21/768*       (2006.01)
*G02F 1/1362*       (2006.01)

(52) U.S. Cl.
CPC .. *H01L 21/76834* (2013.01); *G02F 1/136209* (2013.01); *H01L 21/76892* (2013.01); *G02F 2001/136222* (2013.01)

(58) Field of Classification Search
CPC ................... H01L 21/76834; H01L 21/76892
See application file for complete search history.

(56) References Cited

U.S. PATENT DOCUMENTS

2002/0101557 A1    8/2002   Ono et al.

FOREIGN PATENT DOCUMENTS

| CN | 1369731 A | 9/2002 |
| CN | 103353699 A | 10/2013 |
| CN | 203299499 U | 11/2013 |

OTHER PUBLICATIONS

International Preliminary Report on Patentability Appln. No. PCT/CN2013/088658; Dated Dec. 29, 2015.

(Continued)

*Primary Examiner* — Elias M Ullah
(74) *Attorney, Agent, or Firm* — Ladas & Parry LLP (57) ABSTRACT

An array substrate, a manufacturing method thereof, and a display device are provided. The array substrate includes a thin film transistor on a base substrate, and an electrode structure on the thin film transistor, and the electrode structure includes a pixel electrode and a common electrode insulated from each other. The array substrate further includes: a black matrix disposed on the thin film transistor, an orthographic projection of the thin film transistor on the base substrate is located within an orthographic projection of the black matrix on the base substrate, and the black matrix is electrically connected with the common electrode for providing common electrode signals to the common electrode.

20 Claims, 5 Drawing Sheets

(56) References Cited

OTHER PUBLICATIONS

International Search Report mailed Mar. 4, 2014; PCT/CN2013/088658.
First Chinese Office Action Appln. No. 201310252982.9; Dated Nov. 27, 2014.
Second Chinese Office Action dated Feb. 28, 2015; Appln. No. 201310252982.9.

ARRAY SUBSTRATE AND MANUFACTURING METHOD THEREOF, AND DISPLAY DEVICE

TECHNICAL FIELD

Embodiments of the present invention relate to an array substrate, a manufacturing method thereof and a display device.

BACKGROUND

A liquid crystal display panel mainly consists of an array substrate, a counter substrate and liquid crystal molecules located between the two substrates. Sub-pixel units arranged in a matrix are provided on the array substrate, and each of the sub-pixel units is provided with a thin film transistor (TFT) and a pixel electrode connected to the thin film transistor. A common electrode and color filters in a one-to-one correspondence with the respective sub-pixels are arranged on the counter substrate. Upon the liquid crystal display panel being cell assembled, an alignment is required to be performed between the respective color filters on the counter substrate and the respective sub-pixel units on the array substrate. A bias easily emerges during the alignment. In order to avoid generation of the alignment bias, a structure with the color filters directly arranged on the array substrate (COA, CF on Array) appears.

Figure 1:
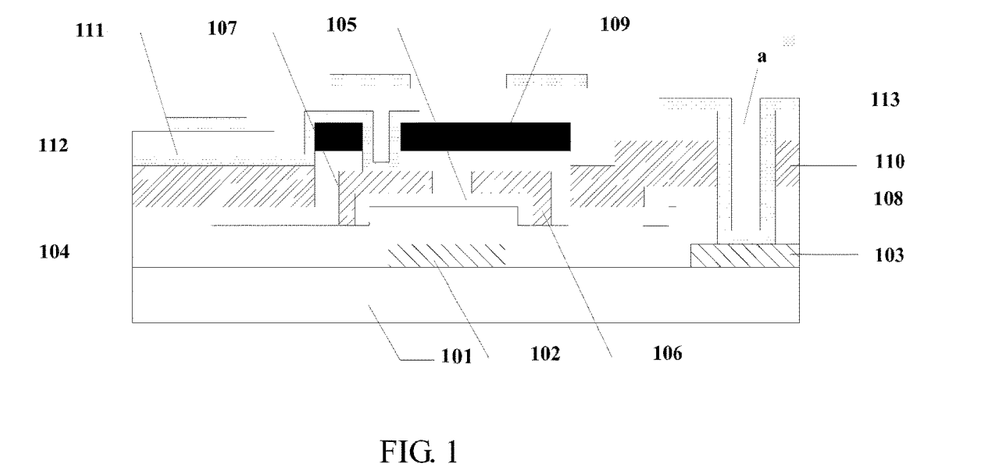
FIG. 1 is a structural schematic view of an array substrate in ADS mode of a COA structure in the prior art.

Presently, the existing COA structure mostly makes the color filters simply directly be superposed on the array substrate. As an example, the COA structure in the mode of an Advanced Super Dimension Switch (ADS), as illustrated in FIG. 1, has a structure on the array substrate, which comprises: a gate electrode 102 and a common electrode line 103, a gate insulating layer 104, an active layer 105, a source electrode 106 and a drain electrode 107, a first insulating layer 108, a black matrix 109, a color filter 110, a pixel electrode 111, a second insulating layer 112, and a common electrode 113, which are arranged sequentially on a base substrate 101. The common electrode 113 passes through the via hole a which penetrates through the gate insulating layer 104, the first insulating layer 108, the color filter 110 and the second insulating layer 112, and electrically connect to the common electrode line 103.

The array substrate of the above structure requires patterning processes by using 10 masks during the manufacture. Concretely, the steps for patterning by using masks are manufacturing the pattern of the gate electrode 102 and the common electrode line 103, the pattern of the active layer 105, the source electrode 106 and the drain electrode 107, the pattern of the gate insulating layer 104 and the first insulating layer 108, the pattern of the black matrix 109, the pattern of the color filter 110, the pattern of the pixel electrode 111, the pattern of the second insulating layer 112 and the pattern of common electrode 113. As the color filter 110 generally consists of homochromatic filters with the primary colors crosswise arranged, which are red, green and blue, it is requires patterning with 3 masks, respectively.

In the above structure, the non-transparent common electrode line 103 and the gate electrode 102 are arranged in the same layer. On the one hand, aperture regions of the respective sub-pixel unit can be occupied, which influences the aperture ratio, and on the other hand, the common electrode 113 is required to electrically connect to the common electrode line 103 by a deeper via hole a, and as this via hole a penetrates the gate insulating layer 104, the first insulating layer 108, the color filter 110 and the second insulating layer 112 with different materials, the formation of the via hole requires several patterning processes during the manufacture, which also increases the difficulty of the entire manufacturing process.

To sum up, problems that the difficulty of the manufacturing process is high and the aperture ratio is low exist in the array substrate in the ADS mode of the existing COA structure.

SUMMARY

Embodiments of the present invention provide an array substrate and a manufacturing method thereof, and a display device, wherein the aperture ratio of COA structure can be increased and the difficulty for manufacturing process can be reduced.

An embodiment of the present invention provides an array substrate comprising a base substrate, a thin film transistor disposed on the base substrate, and an electrode structure disposed on the thin film transistor, the electrode structure comprising a pixel electrode and a common electrode insulated from each other, and further comprising:

a black matrix disposed on the thin film transistor, wherein an orthographic projection of the thin film transistor on the base substrate is located within an orthographic projection of the black matrix on the base substrate; and wherein the black matrix is electrically connected to the common electrode for providing common electrode signals to the common electrode.

Another embodiment of the present invention provides a display device comprising the above array substrate provided by the embodiment of the present invention.

Still another embodiment of the present invention provides a manufacturing method of an array substrate, comprising:

a step of forming a thin film transistor on a base substrate;

a step of forming an electrode structure, wherein the electrode structure comprises a pixel electrode and a common electrode insulated from each other;

a step of forming a black matrix, wherein an orthographic projection of the thin film transistor on the base substrate is located within an orthographic projection of the black matrix on the base substrate, and the black matrix is directly electrically connected to the common electrode for providing common electrode signals to the common electrode.

The embodiments of the present invention have the following beneficial effects.

Embodiments of the present invention provide an array substrate, a manufacturing method thereof, and a display device. The array substrate comprises a thin film transistor disposed on the base substrate, and an electrode structure disposed on the thin film transistor, wherein the electrode structure comprises a pixel electrode and a common electrode insulated from each other; and further comprises a black matrix disposed on the thin film transistor and the orthographic projection thereof on the base substrate covers the thin film transistor, wherein the black matrix is electrically connected to the common electrode for providing common electrode signals to the common electrode. Since the black matrix further has a function of a common electrode line, it is electrically connected to the common electrode line so as to provide the common electrode signals to the common electrode line. Compared with a common electrode line in the prior art which is individually arranged in the same layer with a gate electrode, the aperture regions of respective sub-pixel units are less occupied and the aperture ratio of the substrate is enhanced. Moreover, since the black matrix serving as the common electrode line is arranged on the thin film transistor, films penetrated by a via hole for connecting the black matrix to the common electrode can also be reduced and the difficulty for manufacturing process are also decreased.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The thicknesses and shapes of respective layers of thin films in the accompanying drawings do not reflect the real scale of an array substrate and are intended to schematically explain the content of the present invention.

Figure 2A:
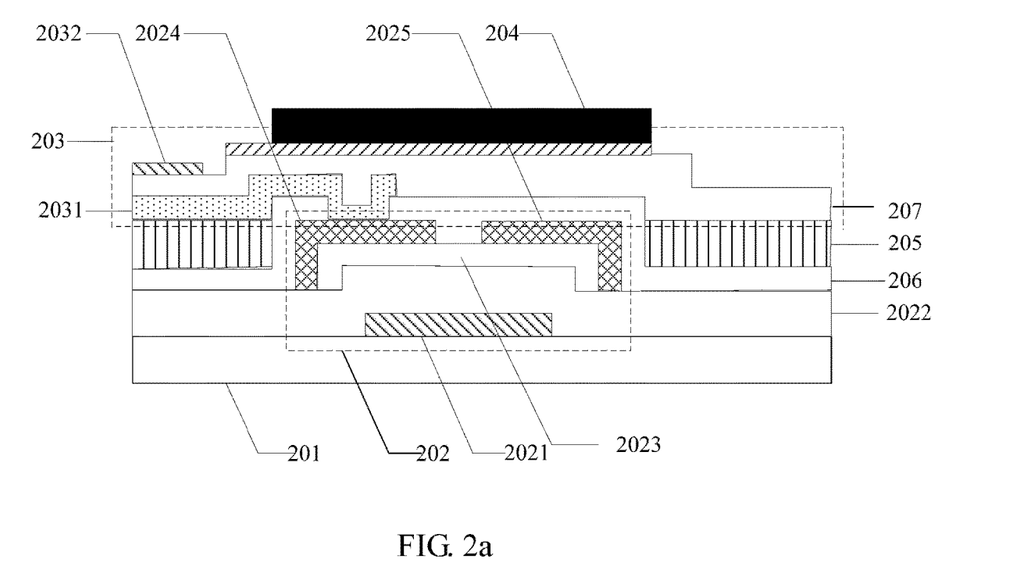
FIGS. 2a to 2c are respectively structural schematic views of an array substrate provided by an embodiment of the present invention.
Figure 2B:
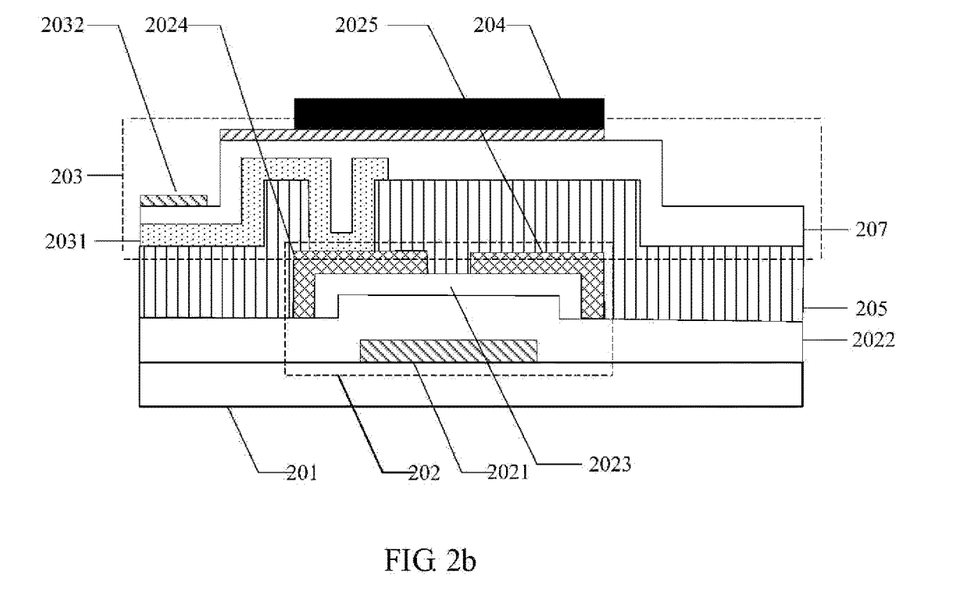
Figure 2C:
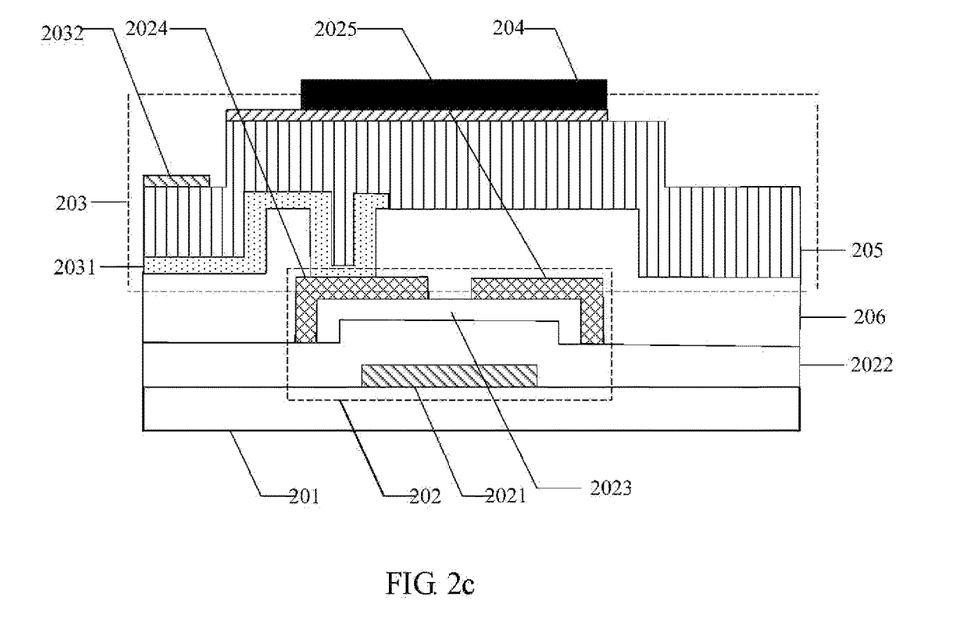

An embodiment of the present invention provides an array substrate, as illustrated in FIGS. 2a to 2c, comprising a base substrate 201, a thin film transistor 202 located on the base substrate 201, and an electrode structure 203 located on the thin film transistor 202, wherein the electrode structure 203 comprises a pixel electrode 2031 and a common electrode 2032 insulated from each other.

The array substrate further comprises a black matrix 204 disposed on the thin film transistor 202 and the orthographic projection thereof on the base substrate 201 covers the thin film transistor 202. That is to say, the orthographic projection of the thin film transistor 202 on the base substrate 201 is located within the orthographic projection of the black matrix 204 on the base substrate 201. The black matrix 204 is electrically connected to the common electrode 2032 for providing common electrode signals to the common electrode 2032.

Concretely, the above array substrate provided by the embodiment of the present invention can be adapted to liquid crystal display screens with a wide viewing angle, such as the types of In-Plane Switch (IPS) and Advanced Super Dimension Switch (ADS), etc., which are not limited herein. The following descriptions are all explained with the application to the liquid crystal display screen of ADS type as an example.

In the above array substrate provided by the embodiment of the present invention, the black matrix is electrically connected to the common electrode and is used to provide common electrode signals to the common electrode. Due to the black matrix further having a function of a common electrode line, it is electrically connected to the common electrode so as to provide the common electrode signals to the common electrode. Compared with a common electrode line in the prior art which is individually arranged in the same layer with a gate electrode, the aperture region of respective sub-pixel units are less occupied and the aperture ratio of the substrate is enhanced. Moreover, since the black matrix serving as the common electrode line is arranged on the thin film transistor, films penetrated by a via hole for connecting the black matrix with the common electrode can also be reduced and the difficulty for manufacturing process is also reduced.

In a specific embodiment, the above array substrate provided by the embodiment of the present invention can adopt a bottom gate structure and consists of a gate electrode 2021, a gate insulating layer 2022, an active layer 2023, a source electrode 2024 and a drain electrode 2025 which are arranged successively on the base substrate 201, as illustrated in FIGS. 2a to 2c. Of course, the thin film transistor 202 in the array substrate in other specific examples can also adopt other structures, which are not limited herein.

The above array substrate provided by the embodiment of the present invention is explained below with a thin film transistor having a bottom gate structure as an example.

Preferably, in the above array substrate provided by the embodiment of the present invention, as illustrated in FIGS. 2a to 2c, the black matrix 204 serving as the common electrode line is arranged to directly electrically connect to the common electrode 2032, that is to say, no additional films are not provided between the black matrix 204 and the common electrode 2032. Compared with the prior art in which a common electrode line is arranged in the same layer with a gate electrode and a common electrode is required to pass through a via hole penetrating a plurality of films to be connected to the common electrode line, the arrangement of the via hole is avoided and the difficulty for manufacturing process is reduced.

In some specific examples, in the above array substrate provided by the embodiment of the present invention, as illustrated in FIGS. 2a to 2c, the black matrix 204 which is directly electrically connected to the common electrode 2032 can be directly arranged on the film of the common electrode 2032. Of course, the black matrix 204 can also be directly arranged below the film of the common electrode 2032, which are not limited herein.

Preferably, as illustrated in FIGS. 2a to 2c, when the structure that the black matrix 204 is directly arranged on the common electrode 2032 is adopted in the above array substrate provided by the embodiment of the present invention, the common electrode 2032 and the black matrix 204 can be manufactured by one patterning process, that is to say, patterns of two films can be manufactured simultaneously by adopting one piece of gray-tone mask or half-tone mask. In this way, compared with the prior art which is required to perform patterning by using 10 masks, the number of times for using the mask can be reduced. Consequently, the manufacturing efficiency is enhanced and the production cost is reduced.

For example, in the above array substrate provided by the embodiment of the present invention, a metallic material or non-transparent organic conductive material can be adopted as the material of the black matrix in order to ensure that the black matrix not only have the non-transparency for performing a light shielding protection for the thin film transistor, but also have the conductivity for transferring the common electrode signals.

For example, in the above array substrate provided by the embodiment of the present invention, as illustrated in FIG. 2a, a first insulating layer 206 which has a function of insulation and protection for the source electrode 2024 and the drain electrode 2025 is provided on the thin film transistor 202, and a color filter 205 is provided on the first insulating layer 206, wherein the color filter 205 generally consists of homochromatic filters with the primary colors crosswise arranged, which are red, green and blue. A second insulating layer 207 is also provided between the pixel electrode 2031 and the common electrode 2032.

Further, in the above array substrate provided by the embodiment of the present invention, as illustrated in FIG. 2b, the first insulating layer 206 can also be omitted between the thin film transistor 202 and the electrode structure 203, and the color filter 205 further has a function of an insulating layer, that is to say, the color filter 205 serving as the insulating layer is directly arranged between the thin film transistor 202 and the electrode structure 203. Likewise, this color filter 205 generally consists of homochromatic filters with the primary colors crosswise arranged, which are red, green and blue. Compared with the structure illustrated in FIG. 2a, the insulating layer is not necessary to be arranged between the source and drain electrodes and the pixel electrode since the color filter further has the function of the insulating layer. In this way, the patterning can be performed with one mask reduced during the manufacture, and the manufacturing efficiency is further enhanced and the production cost is reduced.

Alternatively, in the above array substrate provided by the embodiment of the present invention, as illustrated in FIG. 2c, the color filter 205 can be adopted to replace the second insulating layer 207 in the structure illustrated in FIG. 2a between the pixel electrode 2031 and the common electrode 2032, and the color filter 205 further has a function of a insulating layer, that is to say, the color filter 205 serving as the insulating layer is directly provided between the pixel electrode 2031 and the common electrode 2032. Likewise, this color filter 205 generally consists of homochromatic filters with the primary colors crosswise arranged, which are red, green and blue. Compared with the structure illustrated in FIG. 2a, the insulating layer is not necessary to be arranged since the color filter further has the function of the insulating layer between the pixel electrode and the common electrode. In this way, the patterning can be performed with one mask reduced during the manufacture, and the manufacturing efficiency is further enhanced and the production cost is reduced.

Only the structure of a part of the thin film transistor is illustrated in FIGS. 2a-2c. The array substrate according to the embodiment of the present invention can comprise a plurality of pixel units, and each pixel unit comprises the above thin film transistor, electrode structure and black matrix. Except in the non-display region which is in a correspondence with the thin film transistor, the color filter is further located in the display region outside the thin film transistor. In the display region, for example, in the case that the first insulating layer 206 in FIG. 2a is replaced by the color filter 205, as illustrated in FIG. 2b, the color filter can be provided below the electrode structure; and in the case that the second insulating layer 207 in FIG. 2a is replaced by the color filter 205, as illustrated in FIG. 2c, the color filter can be provided between the pixel electrode and the common electrode in the electrode structure. Each pixel unit comprises a color filter of one color, and a plurality of pixel units comprises color filters of different colors, such that a color display can be realized.

Based on the same inventive concept, an embodiment of the present invention further provides a display device comprising the above array substrate provided by the embodiment of the present invention. This display device can be a mobile telephone, a tablet computer, a television, a display, a notebook computer, a digital photo frame, a navigator and any other products and parts having the display function. This display device can be embodied with reference to the embodiment of the above array substrate, and the repetition would no longer be described herein.

Based on the same inventive concept, an embodiment of the present invention further provides a manufacturing method of an array substrate, concretely comprising the following steps:

a step of forming a thin film transistor on a base substrate;

a step of forming an electrode structure, wherein the electrode structure comprises a pixel electrode and a common electrode insulated from each other;

a step of forming a black matrix, wherein the orthographic projection of the black matrix on the base substrate covers the thin film transistor, and the black matrix is directly electrically connected to the common electrode for providing common electrode signals to the common electrode.

For example, the black matrix can be disposed on the common electrode, that is to say, the black matrix is formed after the common electrode is formed in advance. Certainly, the common electrode can also be disposed on the black matrix, that is to say, the common electrode is formed after the black matrix is formed in advance, which are not limited herein.

For example, when the black matrix is located on the common electrode, the manufacturing method of the array substrate provided by the embodiment of the present invention can comprise the following steps:

step S101: forming a thin film transistor on a base substrate;

step S102: forming an pixel electrode on the thin film transistor;

step S103: forming a common electrode which is insulated from the pixel electrode on the pixel electrode;

step S104: forming a black matrix on the common electrode, wherein the orthographic projection of the black matrix on the base substrate covers the thin film transistor, and the black matrix is directly electrically connected to the common electrode for providing common electrode signals to the common electrode.

The above step S103 of forming the common electrode which is insulated from the pixel electrode on the pixel electrode, and step S104 of forming the black matrix on the common electrode can be realized by adopting one mask, that is to say, patterns of the common electrode and the black matrix can be formed by one patterning process. In this way, compared with the prior art, the number of times for using the mask can be reduced, the manufacturing efficiency is enhanced and the production cost is reduced.

Figure 3A:
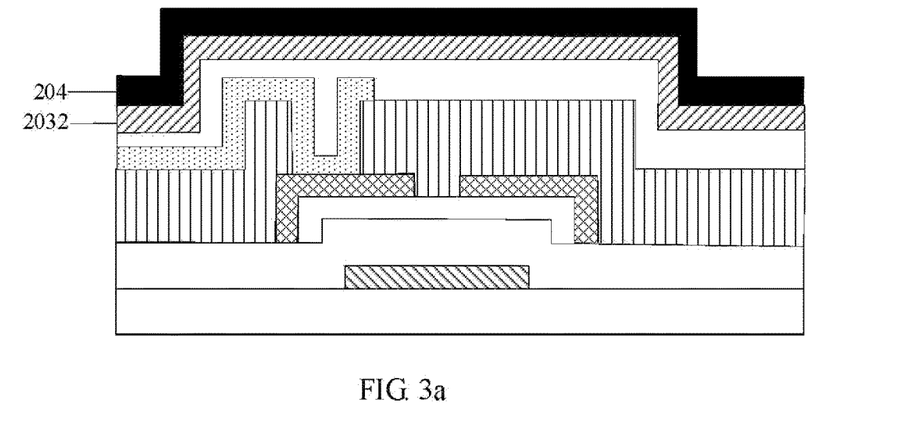
FIGS. 3a to 3f are structural schematic views of respective steps for forming a pattern of a common electrode and a black matrix by one patterning process in a manufacturing method provided by an embodiment of the present invention.
Figure 3B:
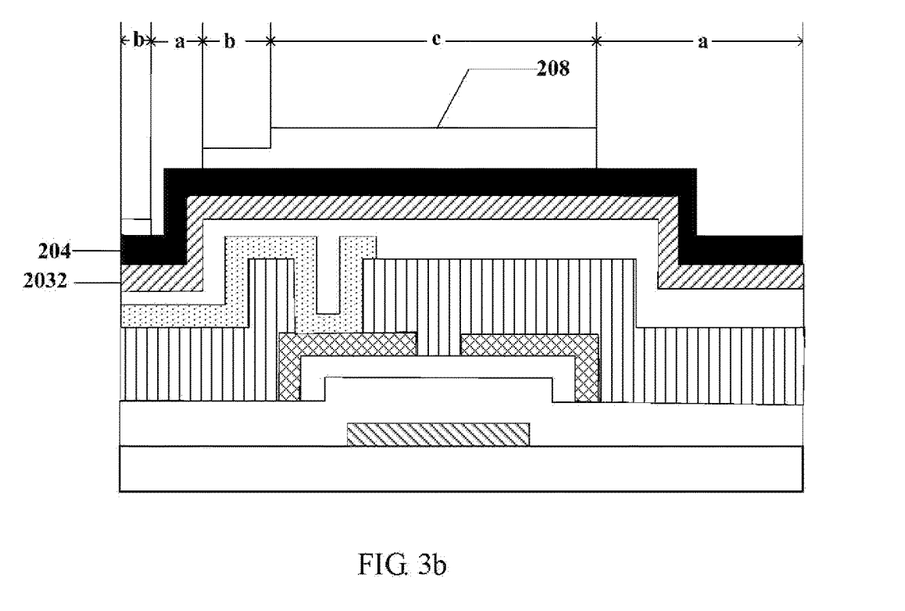

For example, forming the patterns of the common electrode and the black matrix by one patterning process can be realized in the following way:

firstly, successively forming the thin film for the common electrode 2032 and the thin film for the black matrix 204, as illustrated in FIG. 3a;

then, applying photoresist 208 on the thin film for the black matrix, exposing and developing the photoresist 208 by using a mask, as illustrated in FIG. 3b, and obtaining a photoresist-completely-removed region a, a photoresist-partially-retained region b and a photoresist-completely-retained region c, for example, the mask can be a half-tone mask or a gray-tone mask;

the photoresist-partially-retained region b corresponds to the pattern region for forming the common electrode 2032 and the photoresist-completely-retained region c corresponds to the pattern region for forming the black matrix 204;

finally, etching the photoresist-completely-removed region a, the photoresist-partially-retained region b and the photoresist-completely-retained region c to form the patterns of the common electrode 2032 and the black matrix 204.

Figure 3C:
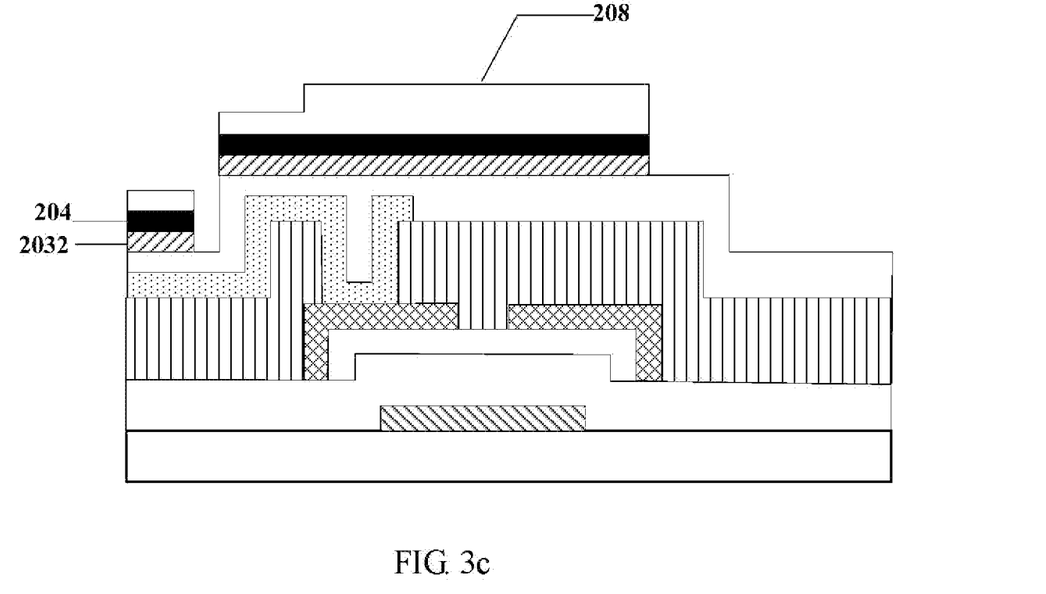
Figure 3D:
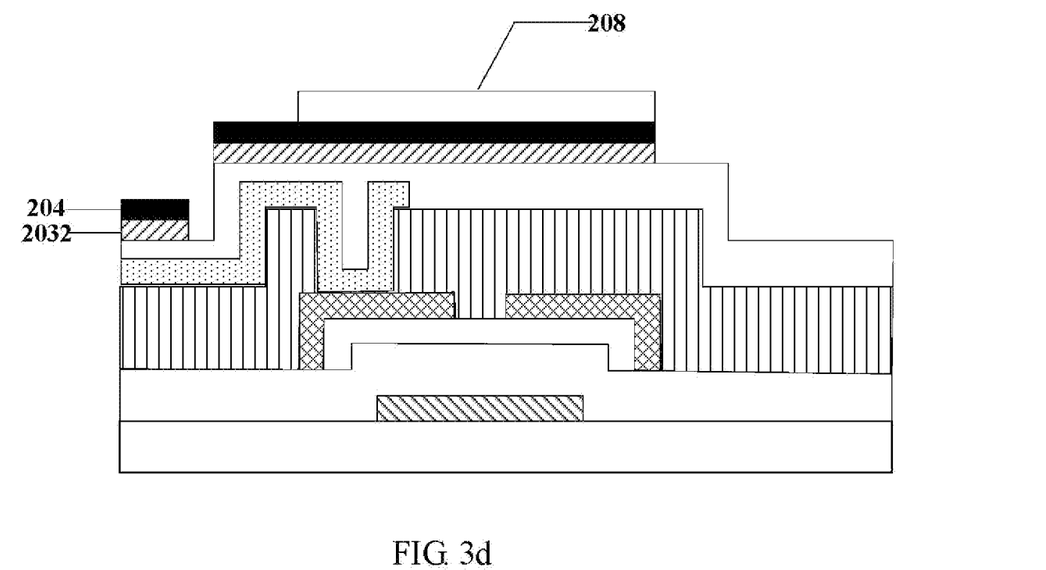
Figure 3E:
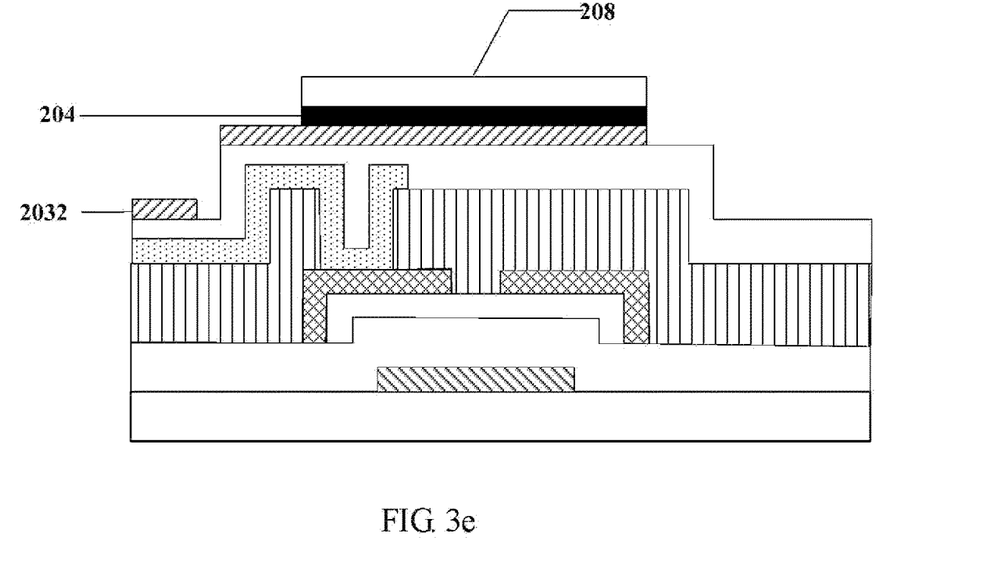
Figure 3F:
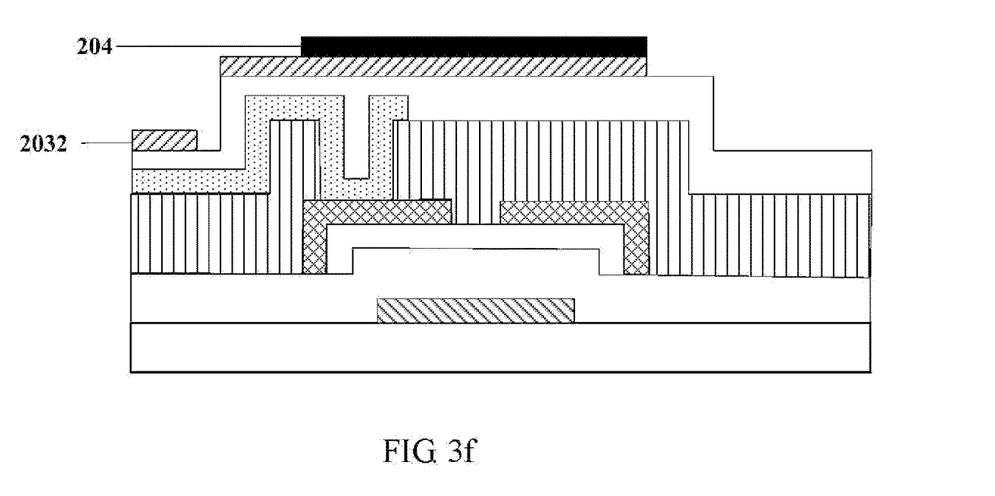

For example, the process for etching the photoresist-completely-removed region a, the photoresist-partially-retained region b and the photoresist-completely-retained region c to form the patterns of the common electrode 2032 and the black matrix 204 can be realized in the following way:

firstly, performing an etching process to etch off the thin film for the common electrode 2032 and the thin film for the black matrix 204 of the photoresist-completely-removed region a and obtaining a pattern of the common electrode 2032, as illustrated in FIG. 3c;

then, performing an ashing process for the photoresist 208 to remove the photoresist 208 of the photoresist-partially-retained region b, as illustrated in FIG. 3d;

then, performing an etching process to etch off the thin film for the black matrix 204 of the photoresist-partially-retained region b, as illustrated in FIG. 3e;

finally, removing the photoresist 208 of the photoresist-completely-retained region c and obtaining a pattern of the black matrix 204, as illustrated in FIG. 3f.

Preferably, in order to ensure that the black matrix not only have the non-transparency for performing a light shielding protection for the thin film transistor, but also have the conductivity for transferring the common electrode signals, for example, a metallic material or non-transparent organic conductive material can be adopted as the material of the black matrix.

Further, the color filter can be formed as the insulating layer on the thin film transistor before the step S102 of forming the pixel electrode on the thin film transistor, and this color filter generally consists of homochromatic filters with the primary colors crosswise arranged, which are red, green and blue. Compared with the manufacturing method for the existing structure, no additional insulating layer is necessarily provided between the source and drain electrodes and the pixel electrode since the color filter further has the function of the insulating layer. In this way, the patterning can be performed with one mask reduced during the manufacture, and the manufacturing efficiency is further enhanced and the production cost is reduced.

Alternatively, the color filter can be formed as the insulating layer on the pixel electrode before the step S103 of forming the common electrode which is insulated from the pixel electrode on the pixel electrode, and this color filter generally consists of homochromatic filters with the primary colors crosswise arranged, which are red, green and blue. Compared with the manufacturing method for the existing structure, no additional insulating layer is necessarily provided between the pixel electrode and the common electrode since the color filter further has the function of the insulating layer. In this way, the patterning can be performed with one mask reduced during the manufacture, and the manufacturing efficiency is further enhanced and the production cost is reduced.

Although the structures of the above array substrates and methods are described only with the arrangement way of successively arranging the thin film transistor, the electrode structure and the black matrix from the base substrate side as an example, embodiments of the present invention are not limited herein. The lamination order of the above thin film transistor, electrode structure and black matrix can vary according to the actual demand as long as the black matrix is electrically connected to the common electrode to avoid further arranging a common electrode line.

The embodiments of the present invention provide an array substrate and a manufacturing method thereof, and a display device. The array substrate comprises a thin film transistor on a base substrate and an electrode structure on the thin film transistor, wherein the electrode structure comprises a pixel electrode and a common electrode insulated from each other, and further comprises a black matrix disposed on the thin film transistor, wherein the orthographic projection of the black matrix on the base substrate covers the thin film transistor, and the black matrix is electrically connected to the common electrode for providing common electrode signals to the common electrode. Since the black matrix further has a function of a common electrode line, it is electrically connected to the common electrode so as to provide the common electrode with the common electrode signals. Compared with a common electrode line in the prior art which is individually arranged in the same layer with a gate electrode, the aperture region of respective sub-pixel units are less occupied and the aperture ratio of the substrate is enhanced. Moreover, since the black matrix serving as the common electrode line is arranged on the thin film transistor, films penetrated by a via hole for connecting the black matrix to the common electrode can also be reduced and the difficulty for manufacturing process are also decreased.

The above are only the example embodiments of the invention, and are not intended to limit the protection scope of the invention. The protection scope of the invention is determined by the appending claims.

The invention claimed is:

1. An array substrate comprising a base substrate, a thin film transistor disposed on the base substrate, and an electrode structure disposed on the thin film transistor, the electrode structure comprising a pixel electrode and a common electrode insulated from each other, and the array substrate further comprising:
   a black matrix disposed on the thin film transistor, wherein an orthographic projection of the thin film transistor on the base substrate is located within an orthographic projection of the black matrix on the base substrate; and
   wherein the black matrix is electrically connected to the common electrode for providing common electrode signals to the common electrode.

2. The array substrate according to claim 1, wherein the black matrix is directly electrically connected to the common electrode.

3. The array substrate according to claim 2, wherein the black matrix is directly disposed on the common electrode.

4. The array substrate according to claim 2, wherein the black matrix is of a metallic material or a non-transparent organic conductive material.

5. The array substrate according to claim 2, wherein the array substrate comprises a plurality of pixel units and each pixel unit comprises the thin film transistor, the electrode structure and the black matrix; and wherein each pixel unit comprises a display region and a non-display region, the thin film transistor is located in the non-display region, a part of the electrode structure is disposed on the thin film transistor, and the other part of the electrode structure is located in the display region.

6. The array substrate according to claim 2, further comprising a color filter located between the thin film transistor and the electrode structure as an insulating layer.

7. The array substrate according to claim 1, wherein the black matrix is of a metallic material or a non-transparent organic conductive material.

8. The array substrate according to claim 1, wherein the array substrate comprises a plurality of pixel units and each pixel unit comprises the thin film transistor, the electrode structure and the black matrix; and wherein each pixel unit comprises a display region and a non-display region, the thin film transistor is located in the non-display region, a part of the electrode structure is disposed on the thin film transistor, and the other part of the electrode structure is located in the display region.

9. The array substrate according to claim 1, further comprising a color filter located between the thin film transistor and the electrode structure as an insulating layer.

10. The array substrate according to claim 1, further comprising a color filter located between the pixel electrode and the common electrode as an insulating layer.

11. A display device comprising an array substrate according to claim 1.

12. A manufacturing method of an array substrate, comprising:
a step of forming a thin film transistor on a base substrate;
a step of forming an electrode structure, wherein the electrode structure comprises a pixel electrode and a common electrode insulated from each other;
a step of forming a black matrix, wherein an orthographic projection of the thin film transistor on the base substrate is located within an orthographic projection of the black matrix on the base substrate, and the black matrix is directly electrically connected to the common electrode for providing common electrode signals to the common electrode.

13. The manufacturing method according to claim 12, wherein the step of forming the electrode structure and the step of forming the black matrix comprise:
forming a pixel electrode on the thin film transistor;
forming a common electrode which is insulated from the pixel electrode on the pixel electrode;
forming a black matrix on the common electrode.

14. The manufacturing method according to claim 13, wherein forming the common electrode which is insulated from the pixel electrode on the pixel electrode and forming the black matrix on the common electrode comprise:

forming the common electrode and the black matrix by one patterning process.

15. The manufacturing method according to claim 14, wherein forming the common electrode and the black matrix by one patterning process comprises:
successively forming a thin film for the common electrode and a thin film for the black matrix;
applying photoresist on the thin film for the black matrix, exposing and developing the photoresist by using a mask, and obtaining a photoresist-completely-removed region, a photoresist-partially-retained region and a photoresist-completely-retained region, wherein the photoresist-partially-retained region corresponds to a region for forming the common electrode and the photoresist-completely-retained region corresponds to a region for forming the black matrix;
etching the photoresist-completely-removed region, the photoresist-partially-retained region and the photoresist-completely-retained region to form the common electrode and the black matrix.

16. The manufacturing method according to claim 15, wherein the mask is a half-tone mask or a gray-tone mask.

17. The manufacturing method according to claim 15, wherein etching the photoresist-completely-removed region, the photoresist-partially-retained region and the photoresist-completely-retained region to form the common electrode and the black matrix comprises:
performing an etching process to etch off the thin film for the common electrode and the thin film for the black matrix of the photoresist-completely-removed region, and obtaining the common electrode;
performing an ashing process on the photoresist to remove the photoresist in the photoresist-partially-retained region;
performing an etching process to etch off the thin film for the black matrix in the photoresist-partially-retained region, removing the photoresist in the photoresist-completely-retained region and obtaining the black matrix.

18. The manufacturing method according to claim 13, wherein after forming the thin film transistor and before forming the pixel electrode, the method further comprises: forming a color filter serving as an insulating layer on the thin film transistor.

19. The manufacturing method according to claim 12, wherein the black matrix is formed of a metallic material or a non-transparent organic conductive material.

20. The manufacturing method according to claim 12, wherein after forming the pixel electrode and before forming the common electrode, the method further comprises: forming a color filter serving as an insulating layer on the pixel electrode.

* * * * *